United States Patent [19]

Austin

[11] Patent Number: 5,311,069
[45] Date of Patent: May 10, 1994

[54] DRIVER CIRCUITRY FOR COMMUTATED INDUCTIVE LOADS

[75] Inventor: Charles C. Austin, Mission Viejo, Calif.

[73] Assignee: Silicon Systems, Inc., Tustin, Calif.

[21] Appl. No.: 756,057

[22] Filed: Sep. 6, 1991

[51] Int. Cl.$^5$ .................. G06G 7/12; H03K 5/153
[52] U.S. Cl. .................... 307/262; 307/494;
307/359; 318/377; 318/375; 318/254
[58] Field of Search ............ 307/443, 359, 494, 262;
318/375-380, 257, 439, 61, 64; 388/807

[56] References Cited

U.S. PATENT DOCUMENTS

| | | | |
|---|---|---|---|
| 3,475,689 | 10/1969 | Gilbert | 307/494 |
| 3,654,560 | 4/1972 | Cath et al. | 307/359 |
| 3,986,127 | 10/1976 | Ray | 307/494 |
| 4,121,203 | 10/1978 | Edwards et al. | 307/262 |
| 4,496,886 | 1/1985 | Gordon et al. | 318/375 |
| 4,767,970 | 8/1988 | Rodal | 318/379 |
| 4,899,068 | 2/1990 | Klose et al. | 307/494 |
| 4,954,759 | 9/1990 | Fey | 318/376 |
| 4,992,677 | 2/1991 | Ishibashi et al. | 307/443 |

FOREIGN PATENT DOCUMENTS

| | | | |
|---|---|---|---|
| 0046784 | 3/1985 | Japan | 318/377 |
| 0296790 | 12/1987 | Japan | 307/270 |

Primary Examiner—Margaret R. Wambach
Attorney, Agent, or Firm—Hecker & Harriman

[57] ABSTRACT

The present invention provides driver circuitry for commutated inductive loads, and in particular, inductive loads employed in multi-pole DC brushless motors. The preferred embodiment of the present invention typically implements three pull-up and three pull-down drivers for motor control. The pull-down driver circuit described in the present invention can be configured to be adjusted by an external component of the integrated circuit implementation in order for controlling turn-off transients. Voltage transients due to changes in load current in the control loop of the pull-down driver circuit can be minimized or deterministically controlled by controlling the rate of change of the input voltage. For the case of when the load current is to be completely switched from one inductor to another inductor, an additional unity gain buffer coupled to the input voltage is inserted into the control loop of the pull-down driver circuit for reducing the voltage transients that can result. The output voltage rise and fall times of the pull-up driver circuit of the present invention can be controlled by means of an accurate clock rate, a capacitance ratio value, an arbitrary voltage supply or by any combination of the above means. The present invention also provides circuitry for controlling the pull-up driver circuit and the pull-down driver circuits as required to assert the floating operation and as well dynamic breaking operation. The present invention is able to assert these operations by operating from either the power supply or from an energy storage capacitor that is charged to a value closely approximating the power supply voltage should the power supply be removed.

17 Claims, 6 Drawing Sheets

FIG. 9

DRIVER CIRCUITRY FOR COMMUTATED INDUCTIVE LOADS

BACKGROUND OF THE INVENTION

1. Field of the Invention

This invention is directed to the field of providing commutation control of inductive loads, and in particular, circuitry for use in controlling multi-pole DC brushless motors.

2. Background Art

There are many applications which require the control of current in inductive loads where the current must be switched (commutated) from one value to another value or from one inductive load to another load. When the current through an inductor is reduced rapidly, a reverse voltage is generated that is proportional to the rate of the current change (di/dt). If the current passing through an inductive load is abruptly interrupted, the voltage generated by the inductor can be of sufficient magnitude to damage other components. Even if the transient is not destructive to other components, it may generate undesirable electromagnetic interference (EMI) which can interfere with the operation of adjacent electronic circuits.

It is therefore desirable to control these transients in such situations. Prior art has employed special networks attached to the inductive load to suppress or reduce the transients. In the past, such devices as flyback diodes or varistors have been used to suppress transients and capacitor or resistor-capacitor networks have been employed to reduce transients.

SUMMARY OF THE INVENTION

The present invention provides driver circuitry for commutated inductive loads, and in particular, inductive loads employed in multi-pole DC brushless motors. The circuitry described, however, is not limited to that application. The preferred embodiment of the present invention implements three pull-up and three pull-down drivers for motor control. For desired operation of multi-pole DC brushless motors, the present invention employs circuitry that provides a "floating" condition as well as a dynamic braking condition between the drivers and the motor. These operating modes can be controlled with or without the main power supply being present in the present invention. Thus, the present invention provides circuitry that will disable a pull-up driver circuit as required to float the load inductor from the power supply and that operates from either the power supply or from an energy storage capacitor should the power supply be removed. Similarly, the present invention provides circuitry that will disable a pull-down driver circuit as required to float the load from ground and that operates from either the power supply or from an energy storage capacitor should the power supply be removed.

The present invention also can activate the pull-down driver to connect the load to ground with low resistance to accomplish dynamic braking operation. Power for this operation is provided either from the power supply or from an energy storage capacitor if the power supply is removed. The invention sequences from normal motor operation to float configuration to dynamic brake operation by activating a multiplicity of control signals. This sequential operation is accomplished in the present invention automatically upon removal of the power supply utilizing energy stored in a capacitor.

The first embodiment of the pull-down driver circuit of the present invention can be configured to be adjustable by a component external to the integrated circuit implementation to control turn-off transients. The pull-down circuitry of the first embodiment comprises a transconductance amplifier control loop controlling the current in a multiplicity of inductive loads which are activated in sequence. The voltage transients due to changes in load current in the control loop can be minimized or deterministically controlled by controlling the rate of change of the input voltage. For the case when the load current is to be completely switched from one inductor to another inductor, an additional unity gain buffer coupled to the input voltage is inserted into the control loop for reducing the voltage transients that can result. This unity gain buffer is designed to have a particular transfer characteristic in order to ensure proper circuit operation.

In another embodiment, the pull-down driver circuit of the present invention is also configured to be adjustable by a component external to the integrated circuit implementation. The pull-down circuitry also comprises a transconductance amplifies control loop controlling the current in a multiplicity of inductive loads which are being commutated. Voltage transients from the commutated load are sensed via the intrinsic parasitic capacitance of the driver transistor.

Furthermore, the control loop includes a current sensing voltage amplifier of selectable gain for optimizing operating conditions for a wide range of load currents such as acceleration vs. constant speed modes.

DETAILED DESCRIPTION OF THE PRESENT INVENTION

The present invention provides driving circuitry for commutated inductive loads for use in controlling multi-pole DC brushless motors. In the following description, numerous specific details are set forth such as voltage levels, types of transistors, etc., in order to provide a more thorough understanding of the present invention. It will be apparent, however, to one skilled in the art, that the present invention may be practiced without these specific details. In other instances, well known circuits have not been described in detail so as not to obscure the present invention.

Figure 1:
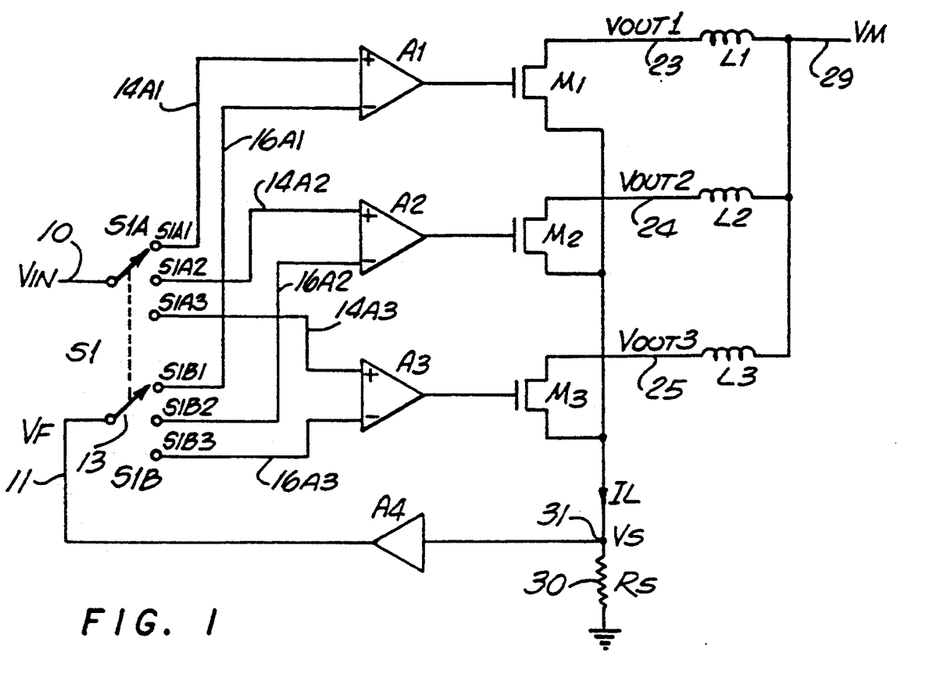
FIG. 1 is a block diagram illustrating three pull-down driver circuits, inductive loads, and the commutation switching configuration of the present invention.

Referring to FIG. 1, an embodiment of the pull-down driver circuit of the present invention is described. A multiplicity of inductive loads, L1, L2, and L3, are to be activated in sequence with a controlled current IL. Typically, the inductive loads are the windings of a brushless DC motor which is commutated (switched) from one winding to the next in sequence to accomplish rotation of the motor. As shown in FIG. 1, input voltage VIN at node 10 is coupled to switch S1A. Switch S1A has three separate conditions where it can be coupled to either line 14A1, 14A2, 14A3. Line 14A1 is coupled to the positive input terminal of amplifier A1. Line 14A2 is coupled to the positive terminal of amplifier A2. Line 14A3 is coupled to the positive terminal of amplifier A3. Voltage VF at node 11 is coupled to switch S1B which is connected to three different positions, position 1, 2, or 3. Positions 1, 2 and 3 correspond to lines 16A1, 16A2 and 16A3. Switches S1A and S1B are controlled such that they operate together in the same positions. For example, whenever switch S1A is coupled to line 14A1, switch S1B is connected to line 16A1.

During all times of operation of the circuit, S1A and S1B are both coupled to the same amplifier, either A1, A2, or A3. Line 16A1 is coupled to the inverting input of amplifier A1, line 16A2 is coupled to the inverting input of amplifier A2, and line 16A3 is coupled to the inverting input of amplifier A3. The output of amplifier A1 is coupled to the gate of NMOS transistor M1. Voltage VOUT1 at node 23 is taken from the drain of transistor of M1 and is coupled to inductor L1. Inductor L1 is coupled to node 29, where voltage VM is present.

The output of amplifier A2 is coupled to the gate of NMOS transistor M2. The drain of transistor M2 is coupled to node 24 where the voltage value VOUT2 is taken from. Node 24 is also coupled to inductor L2. Inductor L2 is coupled to node 24, where voltage VM is present. The output of amplifier A3 is coupled to the gate of NMOS transistor M3. The drain of transistor M3 is coupled to node 25 where voltage value VOUT3 is taken from. Inductor L3 is coupled to node 29, where voltage VM is present. The sources of transistor M1, transistor M2, and transistor M3 are coupled to resistor RS at node 31, where voltage VS is present. Resistor RS is coupled to ground. Voltage VS at node 31 is coupled to the input of adjustable gain amplifier A4. The output of amplifier A4 is coupled to voltage VF at node 11, which is coupled to switch S1B.

As is shown in FIG. 1, the motor is configured in unipolar mode which means that the current IL flows from the source VM through the inductive loads L1, L2, and L3, and is controlled by the driver transistors M1, M2, and M3. The sequencing of the commutation of the inductive loads is accomplished in principle by the action of switches S1A and S1B which are arranged to operate together, selecting connections to positions S1A1/S1B1, S1A2/S1B2 or S1A3/S1B3. For precise control of the motor, the current through the inductor windings must be accurately controlled during the time switches S1A and S1B are at position S1A1/S1B1, S1A2/S1B2 or S1A3/S1B3. This control of the winding current is carried out by a transconductance amplifier control loop formed by amplifier A1 (or A2, or A3, depending upon the position of switches S1A and S1B), transistor M1 (M2, or M3), resistor RS, and amplifier A4.

Amplifiers A1, A2, and A3 are identical, high gain amplifiers. Transistors M1, M2 and M3 are enhancement mode N-channel MOS transistors designed to carry high currents commensurate with the requirements of the loads. Amplifier A4 of FIG. 1 is a fixed-gain, low offset amplifier. The gain of amplifier A4 is adjustable or selected in the range of 1-16 typically. Amplifier A4 can be configured to select several gain values so that for a single value of resistor RS, a wide range of load currents can be controlled by the transconductance loop without the need for a wide range for VS and VIN values. For example, during the acceleration mode of the motor, larger load currents are required than for constant speed mode.

For each position of switches S1A and S1B, the loop is at equilibrium when the voltage VS amplified by amplifier A4 is equal to VIN. During this time, the inputs to the non-inverting and inverting terminals of amplifier A1 (A2 or A3) are equal. VS is given by resistor RS times the load current, thus IL×RS×A$_V$(A4)=VIN so that the transconductance $$\frac{I_n}{V_n} = \frac{1}{(RS \cdot A_V(A4))}$$

where $A_V(A4)$ is the gain factor of amplifier A4.

Figure 2:
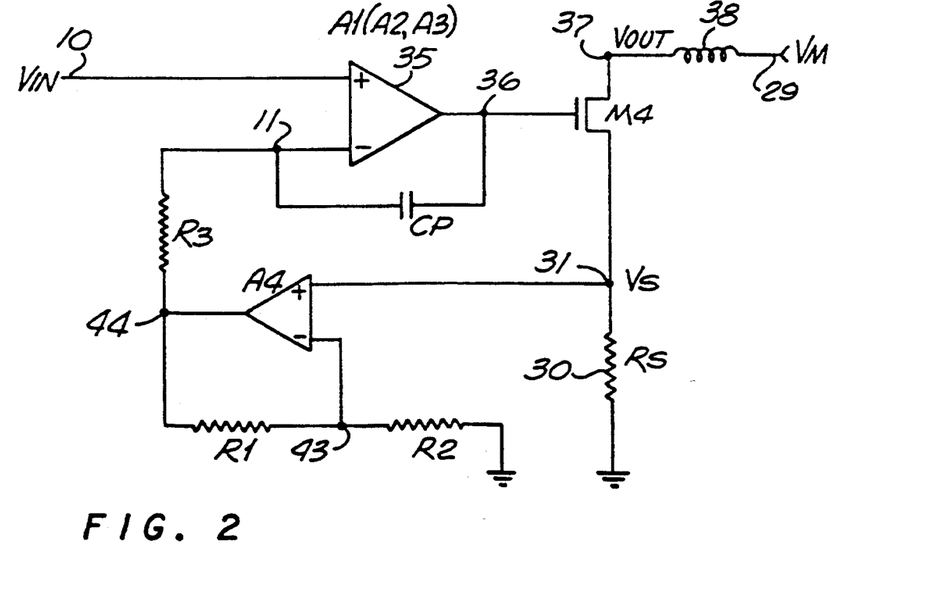
FIG. 2 is a circuit diagram illustrating details of a first embodiment of the pull-down circuit transconductance control loop of the present invention.

FIG. 2 shows a model of the control loop of FIG. 1 utilizing a method of compensation for loop stability. In the circuit model of FIG. 2, input voltage VIN at node 10 is coupled to the non-inverting terminal of amplifier 35 which in the circuit model is signified as being amplifier A1 (although it could signify amplifier A2 or A3). The output of amplifier 35 is provided to the gate of transistor M4 which is representative of either transistor M1, M2 or M3 depending on which amplifier is represented by amplifier 35. Voltage value VOUT is taken from the drain of transistor of M4 at node 37 which is coupled to voltage source VM at node 29 through inductive load 38. The source of transistor M4 is coupled to node 31, which is coupled to ground through resistor RS. Node 31, at which voltage VS is present, is coupled to the non-inverting input of amplifier A4. The inverting input of amplifier A4 is coupled to node 43 which is coupled to ground through resistor R2. Node 43 is feedback coupled to the output of amplifier A4 at node 44 through resistor R1. Node 44 is also coupled to resistor R3 which is coupled to the inverting input of amplifier 35. Capacitor CP is feedback coupled from the inverting input of amplifier 35 to the output of amplifier 35 at node 36.

Resistors R1 and R2 set the gain of amplifier A4 which is designed to be stable at unity gain and has a relatively wide frequency response. The main loop compensation is accomplished with capacitor CP and resistor R3. These components provide a low frequency pole which reduces loop gain to below unity before phase shift to 180 degrees. Use of the components R3 and CP accomplish effective loop compensation largely independent of the characteristics of transistors M1 (M2, M3), the load inductors L1 (L2, L3), and the amplifiers A4 and A1 (A2, A3).

When the loop is closed, voltage transients due to changes in load current can be minimized or deterministically controlled by controlling the rate of change of input voltage VIN. Since VIN sets the current in the inductive load, the rate of change of load current is proportional to the rate of change of VIN. The inductive transient will be given by the relationship $$V = \frac{LdI}{dt}$$

and $$\frac{dI}{dt}$$

is a function of $$\frac{d(V_{IN})}{dt}$$

In applications where load current is to be changed significantly when the loop is closed, limiting the rate of change of VIN is used to reduce transients.

Figure 3:
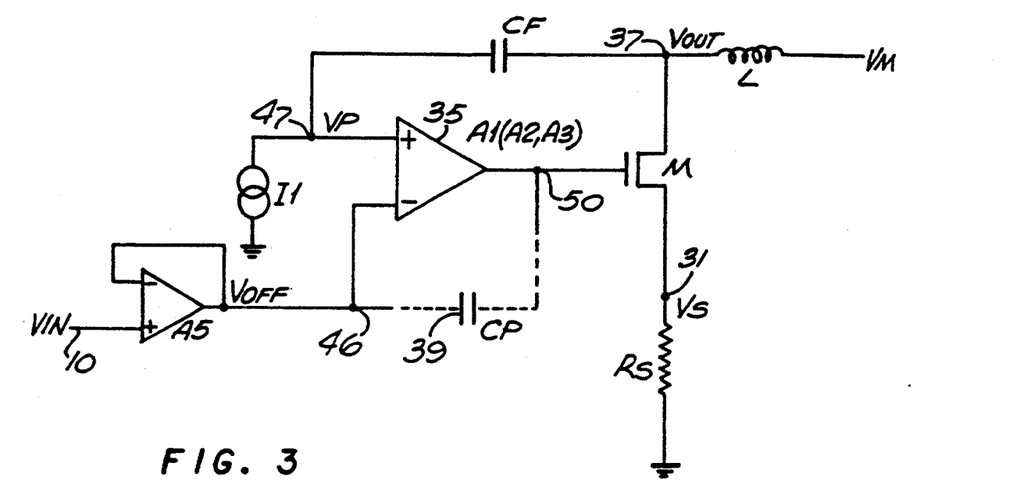
FIG. 3 is a circuit diagram illustrating the first embodiment of the transient suppression circuitry of the pull-down circuit of the present invention.

The circuit of FIG. 3 describes a method to reduce voltage transients that can result when the load current is to be completely switched from one inductor to another inductor. In FIG. 3, input voltage VIN at node 10 is coupled to the non-inverting input of amplifier A5. The output voltage of amplifier A5 is coupled to the inverting input terminal of amplifier A5. The output of amplifier A5 is coupled to node 46 which is also coupled to capacitor CP as well as to the inverting input terminal of amplifier 35, VN. Current source I1 is coupled to ground and is also coupled to the non-inverting terminal of amplifier 35 at node 47. Node 47 is coupled to capacitor CF which is coupled to node 37. The output voltage of amplifier 35 is coupled to node 50 which is coupled to capacitor CP as well being coupled to the gate of transistor M4. The drain of transistor M4 is coupled to node 37 as well as being coupled to inductor L1. Inductor L1 is coupled to voltage supply source VM. The source of transistor M4 is coupled to the first terminal of resistor RS, the second terminal of which is coupled to ground.

In the case of FIG. 3, because the loop is no longer closed around the amplifier and load that is being switched "off", VIN cannot be used to advantage to accomplish transient suppression as discussed in FIG. 2. During operation, at the time just prior to commutation, the inputs to amplifier 35 (VP and VN), are equal to each other and equal to VIN. To accomplish commutation, input VN is switched from node 11 (as shown in FIG. 2) to amplifier A5 output voltage, VOFF, as shown in FIG. 3.

Amplifier A5 is a special unity gain buffer with input VIN. At the time of commutation, amplifier 35 is relatively undisturbed since VIN has been switched to VOFF (which is equal to VIN, the previous input value) and VP has capacitively stored the value of VIN. Current source I1 is attached to node 47 and acts to lower the voltage on VP once it is disconnected from VIN. Lowering voltage VP results in lowering the output of amplifier A1, the input of the transistor M4, and thus reducing the load current.

Capacitor CF is connected from voltage VOUT at node 37 to voltage VP at node 47 and will pass a current $$ICF = CF \cdot \frac{d(V_{Out})}{dt}$$

to voltage VP at node 47. The rate of change of voltage at VOUT is thus controlled such that ICF is equal to I1, so that $$\frac{d(V_{Out})}{dt}$$

is proportional to I1.

For the embodiment of this circuit in integrated circuit form, current source I1 can be set by internal (in circuit) means or by an external resistor. Control with the resistor external to the integrated circuit allows convenient selection and variation based on specifics of load inductance, operating currents, and transient suppression requirements. The value of current I1 is small enough, and the source impedance of voltage VIN is low such that current source I1 can be attached to voltage VP at all times, rather than switched in and out of the circuit during commutation.

Figure 4:
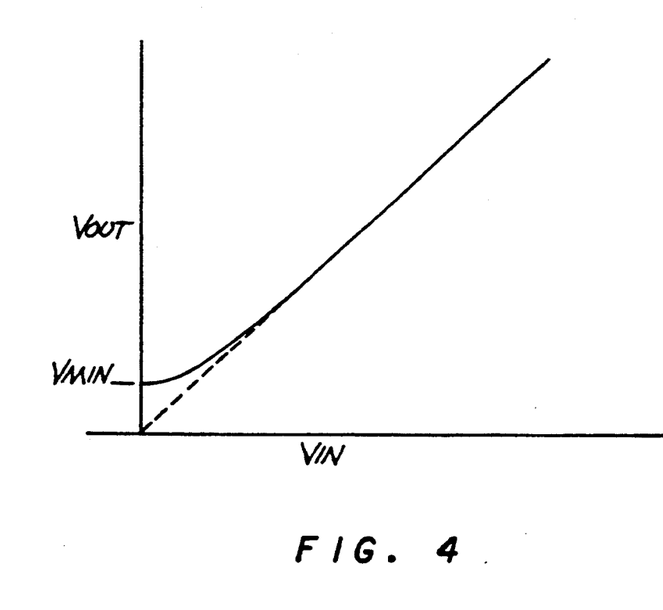
FIG. 4 is a graph illustrating the transfer characteristic of the unity gain amplifier illustrated in FIG. 3.

Amplifier A5 of FIG. 3 is designed for special characteristics in order to ensure proper circuit operation. To reduce the load current to zero, voltage VP at node 47 must be brought to a value less than VOFF (and thus VIN). This must also be true for situations where an amplifier 35 (A1, A2 or A3) exhibits input offset voltage. Amplifier A5 is designed to give the transfer characteristic shown in FIG. 4, wherein for input voltage of zero volts, the output voltage shall be VMIN such that VMIN is greater than the worst expected input output offset of amplifiers A1, A2 and A3. Otherwise, A5 behaves as a unity gain buffer amplifier.

Amplifier A5 is designed to have low output impedance and thus capacitor CP, the loop compensation capacitor, is no longer a factor in loop frequency response. This allows the $$\frac{d(V_{Out})}{dt}$$

(transient suppression) circuitry of A1, CF and I1 to operate with wide bandwidth for better operational characteristics.

Figure 5:
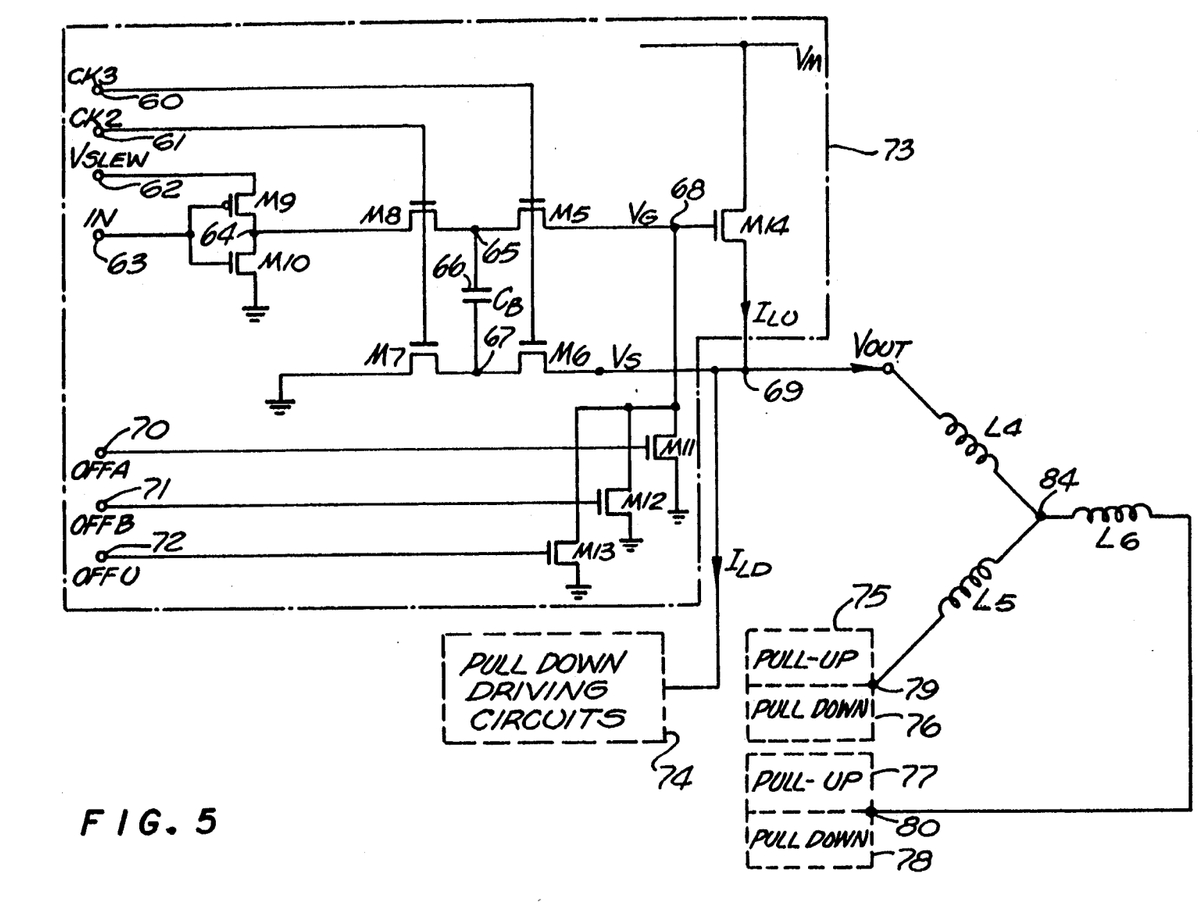
FIG. 5 is a circuit diagram illustrating one embodiment of the pull-up driver circuitry of the present invention and its relationship to the other pull-up and pull-down driver circuits.

FIG. 5 illustrates in detail one of the three pull-up driver circuits used to control the current in one of the inductive loads. Pull-up drivers are required when (in this application) motors have a "y" (shown) or delta configuration and the load current is applied to the coils in two directions. In FIG. 5, input voltage IN at node 63 is coupled to the gates of PMOS transistor M9 as well as NMOS transistor M10. The source of transistor M10 is coupled to ground, and the drain of transistor M10 is coupled to the drain of transistor M9 at node 64. The source of transistor M9 is coupled to voltage source $V_{SLEW}$ at node 62. The drains of transistors M9 and M10 at node 64 are coupled to the source of NMOS transistor M8. Clock signal CK2 at node 61 is coupled to the gates of transistors M8 and M7. Clock signal CK3 at node 60 is coupled to the gates of NMOS transistors M5 and M6. The drain of transistor M8 is coupled to the source of transistor M5 at node 65 which is also coupled to capacitor CB.

The source of transistor M7 is coupled to ground. The drain of transistor M7 is coupled to the source of transistor M6 at node 67 which is also coupled to capacitor CB. The drain of transistor M5 is coupled to the gate of transistor M14 at node 68. Node 68 is also coupled to the drains of NMOS transistors M11, M12, and M13. The drain of transistor M6 is coupled to the source of transistor M14 at node 69 which is also coupled to pull-down driving circuit block 74. The sources of transistors M11, M12, and M13 are coupled to ground. The gate of transistor M11 is coupled to voltage signal OFFA at node 70. The gate of transistor M12 is coupled to voltage signal OFFB at node 71. The gate of transistor M13 is coupled to voltage signal OFFU at node 72.

Node 69 is coupled to node 84 through inductor L4. Node 84 is coupled to pull-up driver circuit 75 and pull-down driver circuit block 76 at node 79 through inductor L5. Node 84 is also coupled to pull-up driving circuit block 77 and pull-down driving circuit block 78 at node 80 through inductor L6. The drain of transistor M14 is coupled to voltage VM. Thus, pull-up driving circuit block 73 is described in detail.

The inductor coils are sequentially activated by having one pull-down circuit "on" and one pull-up circuit "on". For example, pull-down circuit 76 connected to inductor coil L5 is on, and pull-up circuit 73 for inductor coil L4 is also on. At no time should the pull-up and pull-down circuits associated to a particular inductive coil be active at the same time such that current can flow directly from voltage VM to ground. Thus the pull-up driving circuit current ILU of block 73 and the pull-down driving circuit current ILD of block 74 are not to be present simultaneously.

It is desirable in some motor applications to utilize the power generated by a spinning motor (energy stored in the rotating mass) for other circuits in the complete system. This mode of operation can be accomplished since driver transistor M14 is an enhancement-mode N-channel MOS transistor. Thus, when voltage VM drops from its normal operating value to zero volts and the gate voltage of transistor M14 also being zero, no current can flow from the motor to the VM supply.

All transistors shown in FIG. 5 are N-channel enhancement mode MOS transistors except for transistor M9 which is P-channel enhancement mode. Clock signals CK3 and CK2 are repetitive at a rate of several hundred kilohertz with amplitudes of approximately 2 times VM for CK2 and 3 times VM for CK3. These clock signals are non-overlapping, meaning that they never both have non-zero amplitude at the same time. Voltage source VSLEW is typically set to voltage VM. For normal operation, signals OFFA, OFFB, and OFFU are set to zero.

With input voltage IN at node 63 set at voltage amplitude VM, the output voltage at node 64 goes to zero volts since transistor M10 is turned on and transistor M9 is turned off. Because node 64 is at zero volts, capacitor CB is discharged when transistors M7 and M8 are in the conductive state from the action of signal CK2. Transistor M14 is designed to provide a low resistance from voltage VM to the load L4 when M14 is conductive, and as such, transistor M14 exhibits a large capacitance at node 68.

When voltage signal CK3 is active, transistors M5 and M6 transfer charge between capacitor CB and the capacitance at node 68. Thus for node 64 at zero volts, capacitor CB will receive charge from node 68 due to the repetitive action of signals CK2 and CK3. This action keeps transistor M14 in the non-conductive state.

When input voltage IN at node 63 is set low, transistor M10 is turned off and transistor M9 is turned on so that output node 64 is driven to value VSLEW. In this case, when signal CK2 is high, capacitor CB is charged to VSLEW likewise. When signal CK3 is high, the charge on capacitor CB is transferred to node 68, the gate of transistor M14. The capacitor CB is selected to be much smaller in value than the capacitance of node 68, and therefore several cycles of signals CK2 and CK3 are required for the charge, and hence voltage, at node 68 to accumulate sufficiently for transistor M14 to operate in the conductive state.

By the action of transistor M6 controlled by signal CK3, the charge from capacitor CB added to node 68 is transferred to the capacitance between the source and gate of transistor M14. Hence when transistor M14 does begin conduction, the source of transistor M14, node 69, rises causing a like rise in node 68, the gate of transistor M14. It is thus possible to pull node 69 nearly to voltage VM limited only by the resistance of transistor M14 in its conductive state in consideration of the load current. The voltage at node 68 will reach an upper limit of VSLEW+VOUT. The rate of voltage rise of nodes 68 and 69 are a function of the clocking rate of signals CK2 and CK3, the ratio of the values for capacitor CB and the capacitance at node 68, and the magnitude of voltage VSLEW.

When input voltage IN at node 63 is set logically "high" (e.g. =VM) after being low, node 64 will be held to zero volts by the action of transistor M10. Therefore, the repeated action of clock signals CK2 and CK3 will transfer charge from node 68 to capacitor CB, and then discharge capacitor CB to zero through conducting transistor M10. This will progressively lower the voltage at node 68 resulting in changing transistor M14 to the non-conductive state at an arbitrary rate.

"Floating" and "dynamic braking" conditions of the pull-up and pull-down drivers of the present invention are also described. Operation of multi-pole DC brushless motors often requires that the driver circuitry be electrically disabled such that either no current flow occurs between the drivers and the motor ("floating condition") or the drivers are configured such that the inductor coils are connected via low resistance paths to (typically) ground. The latter condition is commonly referred to as dynamic braking because a spinning motor acts as a generator and shorting the coils allows current flow that creates a magnetic force that opposes the rotation and rapidly slows the spin of the motor.

Figure 6:
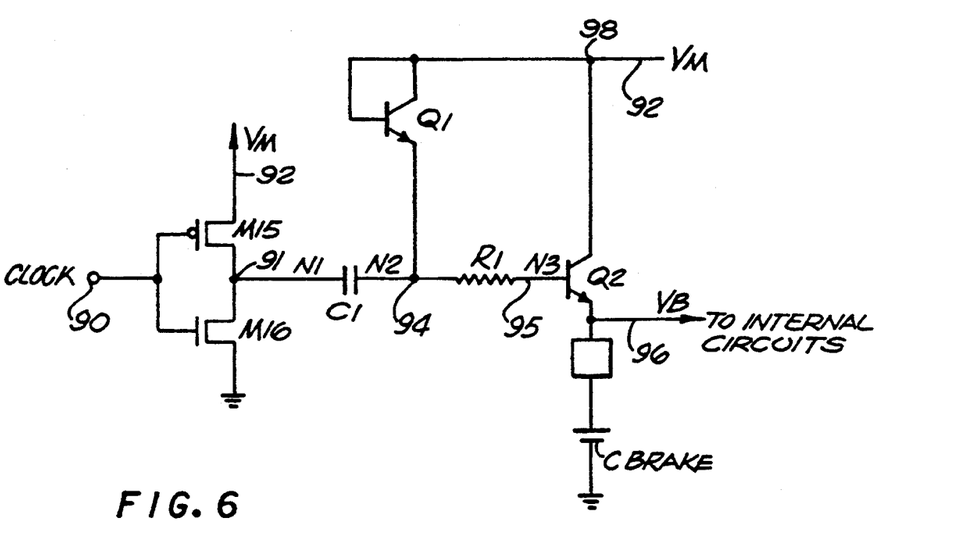
FIG. 6 is a circuit diagram illustrating a means for charging an energy storage capacitor to a value approximating the power supply voltage for operating the driver circuitry of the present invention.

The circuit of FIG. 6 provides the means for storing charge from the power supply VM onto a capacitor where the capacitor will store the voltage necessary to operate the dynamic braking and floating conditions. In FIG. 6, clock signal 90 is provided to the gates of PMOS transistor M15 and NMOS transistor M16. The source of transistor M15 is coupled to voltage supply VM at node 92. The source of transistor M16 is coupled to ground. The drain of transistor M15 is coupled to the drain of transistor M16 at node 91 which is also coupled to capacitor C1. Node 94 is also coupled to capacitor C1 as well as being coupled to the emitter of NPN transistor Q1 and resistor R1. Resistor R1 is also coupled to node 95 at the base of NPN transistor Q2. The base and collector of transistor Q1 are coupled together at node 98 with voltage supply VM at node 92. Node 98 is also coupled to the collector of transistor Q2. The emitter of transistor Q2 is coupled to node 96 where voltage signal VB is taken from. Node 96 is also coupled to capacitor CBRAKE, the other terminal of which is coupled to ground.

Clock signal 90 is a repetitive signal causing the output node 91 of the inverter circuit formed by transistor M15 and transistor M16 to go from ground to VM. Transistor Q1 is a bipolar NPN type transistor and acts like a diode to hold node 94 to voltages in the range of VM minus approximately 0.7 volts or higher. When node 91 is driven to VM by the action of transistor M15, node 94 is forced above VM by the action of capacitor C1. The emitter of transistor Q1 is reverse biased, and current is supplied to the base of transistor Q2 through R1. This allows transistor Q2 to produce emitter current which will charge capacitor CBRAKE. After many cycles of clock signal 90, output voltage 96, VB, will be charged to a value very close to VM. If voltage supply VM is reduced to zero volts, capacitor CBRAKE remains charged due to the reverse bias on the emitter of transistor Q2. This charge stored in capacitor CBRAKE is to be used for asserting the dynamic braking and floating conditions.

Figure 7:
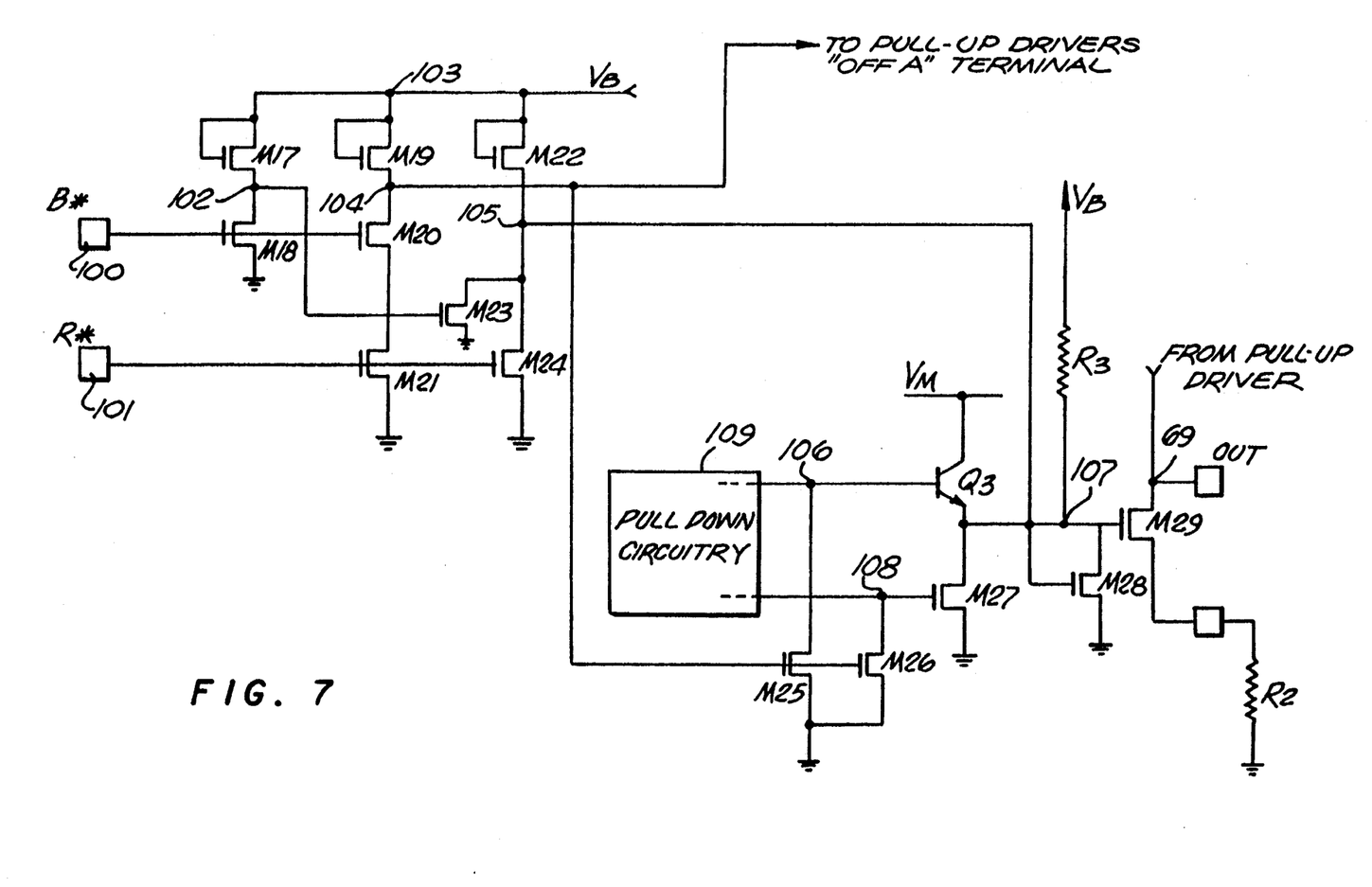
FIG. 7 is a circuit diagram illustrating the means for controlling the floating and braking modes of the pull-up and pull-down drivers of the present invention.

The circuitry which controls the conditions of "float" and "braking" of the pull-up and pull-down drivers of the present invention is shown in FIG. 7. Signal B* at node 100 is coupled to the gates of NMOS transistors M18 and M20. The source of transistor M18 is coupled to ground. The drain of transistor M18 is coupled to the source of transistor M17 at node 102 which is also coupled to the gate of transistor M23. The gate of transistor M17 is coupled to the drain of transistor M17 at node 103 which is also coupled to output voltage VB from FIG. 6. Node 103 is also coupled to the drains of transistors M19 and M22 as well as being coupled to the gates of transistors M19 and M22. The source of transistor M19 is coupled to the drain of transistor M20 at node 104 which is coupled to the gates of transistors M25 and M26, as well as being coupled to the OFFA terminal of pull-up driver circuit 73 shown in FIG. 5. The source of transistor M20 is coupled to the drain of transistor M21. Signal R* at node 101 is coupled to the gates of transistors M21 and M24. The sources of transistors M21 and M24 are coupled to ground. The source of transistor M23 is coupled to ground. The drain of transistor M23 is coupled to the drain of transistor M24 at node 105 which is also coupled to the source of transistor M22 and to the gate of transistor M28.

The source of transistor M28 is coupled to ground. The drain of transistor M28 is coupled to the gate of transistor M29, resistor R3 and the emitter of transistor Q3 at node 107. Resistor R3 is also coupled to voltage VB. The source of transistor M29 is coupled to ground through resistor R2. The drain of transistor M29 is coupled to node 69, the same node 69 found in FIG. 5. Output voltage is taken from node 69 which is coupled to the pull-up driver circuit 73 of FIG. 5. Node 107 is coupled to the drain of transistor M27. The source of transistor M27 is coupled to ground. The gate of transistor M27 is coupled to the drain of transistor M26 as well as coupled to pull-down circuitry block 109. The sources of transistors M25 and M26 are coupled to ground. The drain of transistor M25 is coupled to the base of transistor Q3 and also coupled to the pull-down circuitry block 109. The collector of transistor Q3 is coupled to voltage supply VM.

Transistors M17 through M24 form a circuit that is common to a plurality of drivers for commutative inductive loads, typically three pull-up and three pull-down drivers for motor control. Transistors M17 through M24 are processed to be of like construction, in this embodiment, N-channel enhancement mode MOS transistors so that they will not provide spurious current conduction when VM is below the potential of any of the associated nodes. Therefore, the switching thresholds exhibited by the circuits are stable with variations in transistor parameters being determined to a first order by the size relationships. Transistors M17 and M18 form an inverter, transistors M19, M20 and M21 form a NAND logic gate, and transistors M22, M23 and M24 form a NOR logic gate.

During normal operation, the power supply VM is at its proper value and VB is of a similar value. Due to the action of the circuit which creates VB, VB will be present for sometime after the removal of VM, depending on the value of capacitor CBRAKE, the storage capacitor. The following table is valid for the condition of power "on" with VM and VB present, as well as for the condition of power "off" with only VB present and VM removed.

| B* | R* | N102 | N104 | N105 | N106 | N107 | N108 | Condition |
|---|---|---|---|---|---|---|---|---|
| high | high | zero | zero | zero | (1) | (1) | (1) | normal operation |
| low | high | VB'(2) | VB' | zero | zero | VB | zero | brake |
| high | low | zero | VB' | VB' | zero | zero | zero | float |
| low | low | VB' | VB' | zero | zero | VB | zero | brake |

(1) implies that the state of these nodes is a function of the activity of the particular driver circuitry as represented by block 109.
(2) VB' is more accurately VB minus the threshold of the NMOS load transistor(s) M17, M19 or M22.

The pull-up drivers shown in FIG. 5 are connected to node 104 of FIG. 7. The circuitry of transistors M27, Q3, M25, M26, M28, and M29, and resistor R2 is found as part of each pull-down driver circuit and is shown once for clarity. For node 104 at voltage VB', transistors M25 and M26 force nodes 106 and 108 to zero volts, and the state of node 107 is determined by transistor M28 and resistor R3. For node 105 at VB', node 107 is driven to zero volts, transistor M29 is non-conductive, and the output at node 69 is in the float condition. When node 105 is at zero volts, resistor R3 drives node 107 to voltage VB and puts transistor M29 in the conductive state accomplishing the brake condition.

Figure 8:
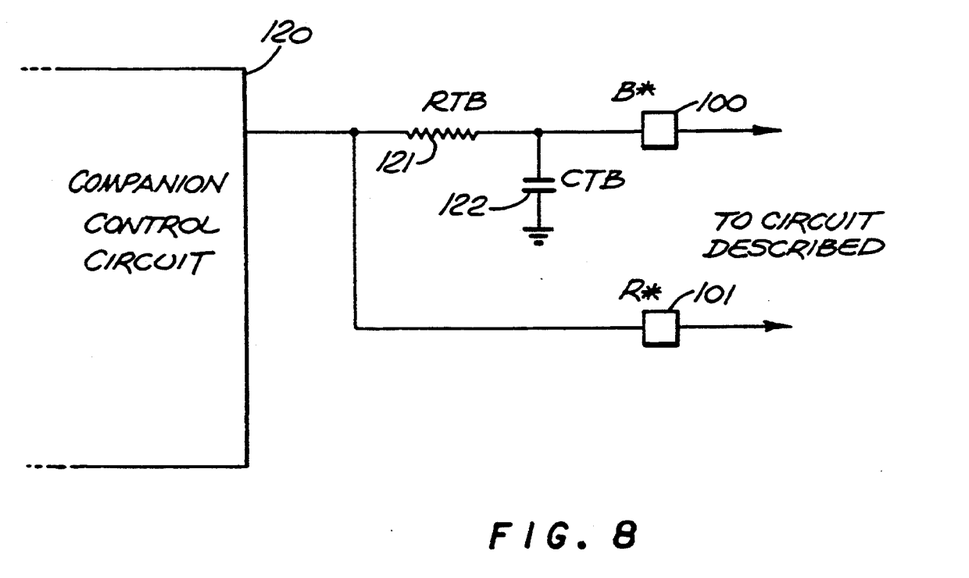
FIG. 8 is a circuit diagram illustrating a circuit for generating the control signals employed by the circuit of FIG. 7.

The signals B* and R* are readily generated in typical applications. Signal R* at node 101 is connected to the systems RESET* (active low) signal line and signal B* at node 100 is connected to the RESET through resistor RTB with capacitor CTB connected from B* to ground as shown in FIG. 8. In FIG. 8, companion control circuit block 120 is coupled to resistor RTB and outputs signal R* at node 101. Resistor RTB is coupled to capacitor CTB and provides signal B* at node 100. Capacitor CTB is coupled to ground.

When the system RESET* is invoked, signal R* will cause the float condition, followed in time depending upon the values of resistor RTB and capacitor CTB, with the brake condition. If RESET* is coupled to the power supply and the power supply is lost or removed, the above sequence will still take place due to the energy stored in capacitor CTB.

Figure 9:
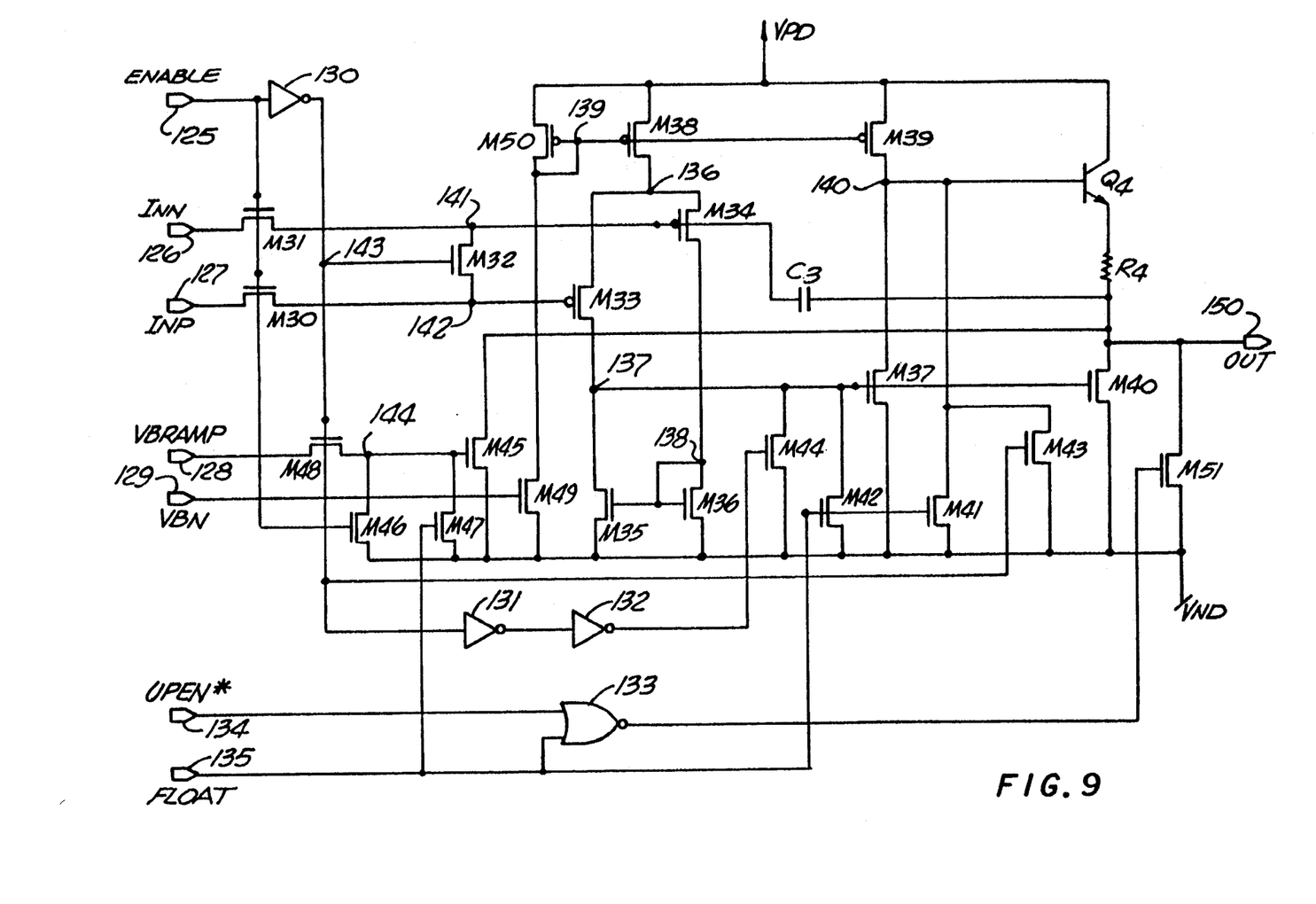
FIG. 9 is a circuit diagram illustrating an alternate method for controlling turn-off transients associated with inductive loads.

An alternate method for controlling turn-off transients with inductive loads is illustrated in FIG. 9. Input signal ENABLE at node 125 is coupled to the input of inverter gate 130 as well as the gates of NMOS transistors M30, M31 and M46. Input signal INN at node 126 is coupled to the drain of transistor M31 and input signal INP at node 127 is coupled to the drain of transistor M30. Signal VBRAMP at node 128 is coupled to the drain of NMOS transistor M48 and signal VBN at node 129 is coupled to the gate of NMOS transistor M49. The output of inverter gate 130 is coupled to the gates of transistors M48, M43 and M32, and also coupled to the input of inverter gate 131 at node 143. The source of transistor M31 is coupled to the drain of transistor M32, the gate of PMOS transistor M34 and capacitor C3 at node 141. The source of transistor M30 is coupled to the source of transistor M32 and the gate of PMOS transistor M33 at node 142. The source of transistor M48 is coupled to the drains of transistors M46 and M47 and the gate of transistor M45 at node 144. The sources of transistors M33 and M34 are coupled to the drain of transistor M38 at node 136.

The gate of PMOS transistor M38 is coupled to the gate and drain of PMOS transistor M50, as well as coupled to the drain of transistor M49 at node 139. The drain of PMOS transistor M33 is coupled to the drains of transistors M35, M44 and M42 and also coupled to the gates of transistors M37 and M40 at node 137. The drain of transistor M34 is coupled to the gate and drain of transistor M36 and the gate of transistor M35 at node 138. The output of inverter 131 is coupled to the input of inverter 132 and the output of inverter gate 132 is coupled to the gate of transistor M44. Signals UPEN* at node 134 and FLOAT at node 135 are coupled to the inputs of NOR gate 133. Signal FLOAT at node 135 is also coupled to the gate of transistor M47. Signal FLOAT at node 135 is also coupled to the gates of transistors M42 and M41. The output of NOR gate 133 is coupled to the gate of transistor M51. The drain of transistor M37 is coupled to the drains of transistors M39, M41 and M43 as well as coupled to the base of transistor Q4 at node 140. The drain of transistor M45 is coupled to the capacitor C3, the resistor R4 and the drains of transistors M40 and M51 providing the output signal OUT at node 150. Resistor R4 is also coupled to the emitter of transistor Q4. The collector of transistor Q4 as well as the sources of transistors M39, M38 and M50 are coupled to supply voltage VPD. The sources of transistors M46, M47, M45, M49, M35, M36, M44, M42, M37, M41, M43, M40 and M51 are coupled to ground.

Referring to the schematic of FIG. 9, transistors M33, M34, M35, M36, M37, M40, M38, M39 and Q4 form the amplifier A1 discussed in FIG. 3. Capacitor C3 is shown as CP in FIG. 2, the loop compensation capacitor. Transistors M41 and M42 are part of the braking and retract circuitry also discussed previously (as M25 and M26 of FIG. 7). Transistors M30, M31 and M32 switch the connections of inputs INN and INP, which are present at nodes 126 and 127 of amplifier A1, to determine the nodes to which nodes 141 and 142 are coupled. The circuitry added to accomplish the dV/dT control of the switched inductive load consists of transistors M44 and M43, which function to force the output of amplifier A1 to a high impedance condition at node 150 by putting Q4 and M40 in non-conductive states, and transistor M45, which forms a current source controlled by the voltage signal VBRAMP at node 128. Transistors M46, M47 and M48 act to enable and disable the current source as required during load commutation and normal operation governed by the input signals FLOAT at node 135 and ENABLE at node 125. Logic inverter gates 130, 131 and 132, and NOR gate 133 are also required to affect normal commutation and special operations associated with retract and brake operation when VPD is present.

When ENABLE signal 125 is high, this circuit is functioning as amplifier A1 in a transconductance amplifier mode per FIG. 2. Input signal VBN at node 129 is a bias voltage that sets the operating current for the amplifier A1 by the action of M49, M50, M39 and M38. Voltage VBRAMP at node 128 is similar, but is controlled by an external resistor such that the current provided by transistor M45 is a fraction of the current (in the present embodiment it is one-fifth) through an external resistor. During normal operation, signal FLOAT at node 135 is low and signal UPEN* at node 134 is the control signal for the upper driver associated with the lower driver. Thus, if signal UPEN* at node 134 is active, that is, the upper driver is enabled, signal UPEN* at node 134 is low and transistor M51 is put into the conductive state. This assures that the output of amplifier A1 is always low whenever the respective upper driver is active and no current is directed through the upper driver and hence the lower driver of the same pair. This is required, since transistor M45 (the current source) may be set by the user to produce a very low current and the output node 150, which is the gate signal to the output driver transistor (e.g., M1 of FIG. 1), may be affected adversely by noise signals.

The dV/dT action is accomplished due to the intrinsic capacitance of the output transistor (M4 in FIG. 2) and current source transistor M45. When signal ENABLE at node 125 goes low, transistor M45 is configured as a current source via the action of transistors M48, M46, and VBRAMP, and the output of amplifier A1 is turned to high impedance condition due to transistors M42 and M41. Thus, transistor M45 as a current source pulls current out of the output node 150, lowering the voltage and causing the output driver transistor (M4 of FIG. 2) to turn off. As the output driver transistor turns off and the current of the load inductance decreases, a transient voltage is created from the dI/dT of the inductance. Transistor M4 (of FIG. 2) is a large N-channel MOSFET designed to pass the high currents required by the specified load for the system. All MOSFET's contain parasitic capacitances among and between their terminals, and the capacitance from the gate to drain is used by the circuit as the feedback element. As the voltage at the drain of transistor M4 (FIG. 2) changes, current flows through the gate-to-drain capacitance and the current flows in opposition to the current of transistor M45. Thus, if the voltage developed by the load switching to "off" rises quickly, it develops a current flow which acts to raise the voltage of node 150 and turn transistor M4 (of FIG. 3) on, preventing load current turn-off. The transient voltage across the load is constrained (approximately) such that $d(VOUT)/dT \times C(\text{gate-to-drain}) = I(M45)$. Since all of the transistors of this circuit are contained on a single integrated circuit, the value of the feedback capacitance is reasonably well known.

Furthermore, this circuitry is consistent with the previous functions required for disk drive spindle motor control, in that it works for the braking and retract modes of the disk drive system.

Thus a means for controlling current in inductive loads and for controlling voltage transients during commutation is described.

I claim:

1. A transconductance amplifier loop used as a pull-down driver circuit for commutating inductive loads comprising:
   an input voltage;
   an operational amplifier coupled to said input voltage;
   a driving transistor coupled to said operational amplifier for controlling a constant current;
   a resistor coupled to said driving transistor;
   a variable gain amplifier coupled to said resistor and to said operational amplifier.

2. The circuit of claim 1 wherein turn-off transients due to said constant current through said driving transistor can be controlled by the rate of change of said input voltage.

3. The circuit of claim 2 wherein the output of said driving transistor is coupled to an inductive load.

4. The circuit of claim 3 wherein said variable gain amplifier is of selectable gain for optimizing operating conditions for a wide range of constant currents.

5. The circuit of claim 4 wherein a capacitor is feedback coupled between an output and an input of said operational amplifier and a second resistor is coupled between said variable gain amplifier and said operational amplifier, said capacitor and said second resistor for preventing a transconductance control loop from oscillating spuriously.

6. A pull-down driver circuit that reduces voltage transients that result when switching a load current from a first inductor to a second inductor comprising:
   an input voltage coupled to a first gain buffer;
   said first gain buffer coupled to an operational amplifier;
   a first current source coupled to said operational amplifier and to a first capacitor;
   a driving transistor coupled to an output of said operational amplifier as well as to said first capacitor as well as coupled to a first resistor.

7. The circuit of claim 6 wherein said first gain buffer is used for assuring complete turn-off of said load current from said first inductor.

8. The circuit of claim 7 wherein said first gain buffer is a modified unity gain buffer and for said input voltage of zero volts, an output voltage of said first gain buffer is greater than the worst expected input offset of said operational amplifier.

9. The circuit of claim 8 wherein an external component coupled to said current source can be adjusted to control turn-off transients and commutation of said pull-down driver circuit.

10. A method for controlling the output voltage rise and fall times of a pull-up driver circuit used in commutating of inductive loads comprising the steps of:
    providing an accurate clock rate for controlling said pull-up driver circuit;
    providing a capacitance ratio between a first and second capacitance of said pull-up driver circuit;
    controlling a voltage supply coupled to said pull-up driver circuit.

11. A circuit coupled to pull-down and pull-up drivers circuits used for commutating inductive loads where said circuit disables and activates said pull-up and pull-down drivers circuits for asserting the desired operation, said circuit comprising:
    an inverter;
    a NAND logic gate coupled to said inverter;
    a NOR logic gate coupled to said inverter and to said NAND logic gate;
    said NOR gate coupled to said pull-down drivers circuits;
    said NAND gate coupled to said pull-down and said pull-up drivers circuits.

12. The circuit of claim 11 wherein a first signal is coupled to said inverter and said NAND logic gate, and a second signal is coupled to said NAND and NOR logic gates.

13. The circuit of claim 12 wherein said first and second signals control the timing of a floating and a dynamic braking condition of said pull-up and pull-down drivers circuits.

14. The circuit of claim 13 wherein said circuit operates from either a power supply or from an energy storage capacitor should said power supply be removed.

15. A circuit that reduces voltage transients that result when switching a load current comprising:
    an operational amplifier receiving an input voltage;
    a current source coupled to an output of said operational amplifier;
    a driving transistor also coupled to said output of said operational amplifier, said driving transistor having an intrinsic gate-to-drain capacitance;
    an inductor coupled to an output of said driving transistor.

16. The circuit of claim 15 wherein said gain-to-drain capacitance of said driving transistor is used as a feedback element to said operational amplifier for reducing voltage transients.

17. The circuit of claim 16 wherein a first control signal sets the current of said current source.

* * * * *